United States Patent
Preusse et al.

(10) Patent No.: US 7,745,327 B2
(45) Date of Patent: Jun. 29, 2010

(54) METHOD OF FORMING A COPPER-BASED METALLIZATION LAYER INCLUDING A CONDUCTIVE CAP LAYER BY AN ADVANCED INTEGRATION REGIME

(75) Inventors: Axel Preusse, Radebeul (DE); Michael Friedemann, Dresden (DE); Robert Seidel, Dresden (DE); Berit Freudenberg, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/761,444

(22) Filed: Jun. 12, 2007

(65) Prior Publication Data

US 2008/0182406 A1    Jul. 31, 2008

(30) Foreign Application Priority Data

Jan. 31, 2007    (DE)    .................. 10 2007 004 860

(51) Int. Cl.
*H01L 21/4763*    (2006.01)
(52) U.S. Cl. .................. 438/627; 438/626; 438/638; 438/622; 438/623; 438/643; 438/648; 438/653; 438/656; 438/672; 438/685; 438/687; 438/688; 438/629; 257/E23.145; 257/E21.579; 257/758; 257/774
(58) Field of Classification Search .................. 438/618, 438/619–629
See application file for complete search history.

(56) References Cited

U.S. PATENT DOCUMENTS

| | | | | |
|---|---|---|---|---|
| 5,127,986 A | * | 7/1992 | August et al. .................. 216/13 |
| 5,399,527 A | * | 3/1995 | Tabara ......................... 438/625 |
| 5,470,790 A | * | 11/1995 | Myers et al. ................ 438/625 |
| 5,563,099 A | * | 10/1996 | Grass ........................ 438/632 |
| 5,770,885 A | * | 6/1998 | McCollum et al. .......... 257/530 |
| 5,900,672 A | * | 5/1999 | Chan et al. .................. 257/751 |
| 5,904,565 A | * | 5/1999 | Nguyen et al. .............. 438/687 |
| 5,916,011 A | * | 6/1999 | Kim et al. ...................... 451/41 |
| 5,961,791 A | * | 10/1999 | Frisa et al. ............... 204/192.1 |
| 5,966,634 A | * | 10/1999 | Inohara et al. .............. 438/687 |
| 6,004,876 A | * | 12/1999 | Kwon et al. ................. 438/636 |
| 6,005,291 A | * | 12/1999 | Koyanagi et al. ........... 257/751 |
| 6,008,114 A | * | 12/1999 | Li .............................. 438/618 |
| 6,037,664 A | * | 3/2000 | Zhao et al. .................. 257/758 |
| 6,040,243 A | * | 3/2000 | Li et al. ...................... 438/687 |

(Continued)

FOREIGN PATENT DOCUMENTS

WO    WO 02/39500 A2    5/2002

OTHER PUBLICATIONS

Translation of Official Communication from German Patent Office for German Patent Application No. 10 2007 004 860.4-33 dated Oct. 2, 2007.

*Primary Examiner*—Fernando L Toledo
*Assistant Examiner*—Ankush K Singal
(74) *Attorney, Agent, or Firm*—Williams, Morgan & Amerson, P.C.

(57) ABSTRACT

By appropriately designing a plurality of deposition steps and intermediate sputter processes, the formation of a barrier material within a via opening may be accomplished on the basis of a highly efficient process strategy that readily integrates conductive cap layers formed above metal-containing regions into well-approved process sequences.

18 Claims, 3 Drawing Sheets

U.S. PATENT DOCUMENTS

| | | | | |
|---|---|---|---|---|
| 6,100,184 | A * | 8/2000 | Zhao et al. | 438/638 |
| 6,114,243 | A * | 9/2000 | Gupta et al. | 438/687 |
| 6,130,482 | A * | 10/2000 | Iio et al. | 257/774 |
| 6,169,024 | B1 * | 1/2001 | Hussein | 438/627 |
| 6,249,056 | B1 * | 6/2001 | Kwon et al. | 257/758 |
| 6,274,008 | B1 * | 8/2001 | Gopalraja et al. | 204/192.17 |
| 6,287,977 | B1 * | 9/2001 | Hashim et al. | 438/722 |
| 6,313,028 | B2 * | 11/2001 | Huang et al. | 438/637 |
| 6,380,075 | B1 * | 4/2002 | Cabral et al. | 438/637 |
| 6,451,177 | B1 * | 9/2002 | Gopalraja et al. | 204/192.12 |
| 6,492,270 | B1 * | 12/2002 | Lou | 438/687 |
| 6,498,091 | B1 * | 12/2002 | Chen et al. | 438/627 |
| 6,541,374 | B1 * | 4/2003 | de Felipe et al. | 438/648 |
| 6,559,061 | B2 * | 5/2003 | Hashim et al. | 438/722 |
| 6,562,712 | B2 * | 5/2003 | Liu et al. | 438/631 |
| 6,607,977 | B1 * | 8/2003 | Rozbicki et al. | 438/627 |
| 6,613,664 | B2 * | 9/2003 | Barth et al. | 438/629 |
| 6,642,146 | B1 * | 11/2003 | Rozbicki et al. | 438/687 |
| 6,660,627 | B2 * | 12/2003 | Hu et al. | 438/624 |
| 6,689,684 | B1 * | 2/2004 | You et al. | 438/639 |
| 6,706,629 | B1 * | 3/2004 | Lin et al. | 438/687 |
| 6,740,976 | B2 * | 5/2004 | Lee | 257/758 |
| 6,764,940 | B1 * | 7/2004 | Rozbicki et al. | 438/627 |
| 6,806,192 | B2 * | 10/2004 | Lin et al. | 438/687 |
| 6,869,810 | B2 * | 3/2005 | Joei | 438/14 |
| 6,939,803 | B2 * | 9/2005 | Marathe et al. | 438/667 |
| 6,949,461 | B2 | 9/2005 | Malhotra et al. | 438/643 |
| 6,951,809 | B2 * | 10/2005 | Tarumi et al. | 438/627 |
| 6,977,217 | B1 * | 12/2005 | Ben-Tzur et al. | 438/627 |
| 6,992,012 | B2 * | 1/2006 | Hashim et al. | 438/722 |
| 6,998,338 | B2 * | 2/2006 | Engelhardt | 438/622 |
| 7,008,872 | B2 * | 3/2006 | Dubin et al. | 438/678 |
| 7,026,238 | B2 * | 4/2006 | Xi et al. | 438/625 |
| 7,037,835 | B2 * | 5/2006 | Lee et al. | 438/682 |
| 7,060,603 | B2 * | 6/2006 | Han et al. | 438/618 |
| 7,141,880 | B2 * | 11/2006 | Han | 257/751 |
| 7,186,648 | B1 * | 3/2007 | Rozbicki et al. | 438/687 |
| 7,193,327 | B2 * | 3/2007 | Yu et al. | 257/774 |
| 7,208,415 | B2 * | 4/2007 | Lai et al. | 438/687 |
| 7,215,024 | B2 * | 5/2007 | Lin et al. | 257/734 |
| 7,241,696 | B2 * | 7/2007 | Clevenger et al. | 438/722 |
| 7,244,344 | B2 * | 7/2007 | Brown et al. | 204/298.11 |
| 7,282,802 | B2 * | 10/2007 | Clevenger et al. | 257/751 |
| 7,285,489 | B2 * | 10/2007 | Tu | 438/638 |
| 7,309,658 | B2 * | 12/2007 | Lazovsky et al. | 438/754 |
| 7,400,045 | B2 * | 7/2008 | Isono | 257/758 |
| 7,422,979 | B2 * | 9/2008 | Michaelson et al. | 438/643 |
| 7,439,624 | B2 * | 10/2008 | Yang et al. | 257/758 |
| 7,576,002 | B2 * | 8/2009 | Chen et al. | 438/653 |
| 2001/0018273 | A1 * | 8/2001 | Park et al. | 438/762 |
| 2002/0001939 | A1 * | 1/2002 | Kinoshita et al. | 438/622 |
| 2002/0064941 | A1 * | 5/2002 | Chooi et al. | 438/633 |
| 2002/0086518 | A1 * | 7/2002 | Asami | 438/622 |
| 2002/0115287 | A1 * | 8/2002 | Hashim et al. | 438/653 |
| 2002/0117399 | A1 * | 8/2002 | Chen et al. | 205/125 |
| 2002/0171147 | A1 * | 11/2002 | Yew et al. | 257/751 |
| 2003/0057562 | A1 * | 3/2003 | Tsukamoto | 257/774 |
| 2003/0160331 | A1 * | 8/2003 | Fujisawa | 257/774 |
| 2003/0160333 | A1 * | 8/2003 | Kim et al. | 257/774 |
| 2003/0170975 | A1 * | 9/2003 | Griffin et al. | 438/637 |
| 2003/0194872 | A1 * | 10/2003 | Parikh et al. | 438/694 |
| 2004/0048468 | A1 * | 3/2004 | Liu et al. | 438/687 |
| 2004/0110370 | A1 * | 6/2004 | Okayama et al. | 438/638 |
| 2004/0147117 | A1 * | 7/2004 | Ngo et al. | 438/687 |
| 2004/0209460 | A1 * | 10/2004 | Xi et al. | 438/643 |
| 2004/0238961 | A1 | 12/2004 | Cunningham | 257/758 |
| 2004/0251552 | A1 * | 12/2004 | Takewaki et al. | 257/758 |
| 2004/0266172 | A1 * | 12/2004 | Kim | 438/623 |
| 2005/0020058 | A1 * | 1/2005 | Gracias et al. | 438/643 |
| 2005/0046027 | A1 * | 3/2005 | Kim et al. | 257/750 |
| 2005/0079701 | A1 * | 4/2005 | Baks et al. | 438/622 |
| 2005/0118796 | A1 * | 6/2005 | Chiras et al. | 438/618 |
| 2005/0127511 | A1 | 6/2005 | Yang et al. | 257/758 |
| 2005/0148168 | A1 * | 7/2005 | Tseng | 438/637 |
| 2005/0239278 | A1 * | 10/2005 | Li et al. | 438/618 |
| 2006/0019485 | A1 * | 1/2006 | Komai et al. | 438/627 |
| 2006/0065979 | A1 * | 3/2006 | Moritoki et al. | 257/758 |
| 2006/0118962 | A1 * | 6/2006 | Huang et al. | 257/760 |
| 2006/0166488 | A1 * | 7/2006 | Usami et al. | 438/627 |
| 2006/0205204 | A1 * | 9/2006 | Beck | 438/628 |
| 2006/0249849 | A1 | 11/2006 | Cohen | 257/758 |
| 2007/0077761 | A1 * | 4/2007 | Lehr et al. | 438/687 |
| 2007/0151861 | A1 * | 7/2007 | Xl et al. | 205/183 |
| 2007/0202689 | A1 * | 8/2007 | Choi et al. | 438/637 |
| 2007/0224855 | A1 * | 9/2007 | Lee et al. | 439/82 |
| 2007/0249163 | A1 * | 10/2007 | Oikawa | 438/637 |
| 2007/0257366 | A1 * | 11/2007 | Wang et al. | 257/751 |
| 2008/0057704 | A1 * | 3/2008 | Koike et al. | 438/627 |
| 2008/0105977 | A1 * | 5/2008 | Luce et al. | 257/751 |
| 2008/0136032 | A1 * | 6/2008 | Forster et al. | 257/753 |

* cited by examiner

METHOD OF FORMING A COPPER-BASED METALLIZATION LAYER INCLUDING A CONDUCTIVE CAP LAYER BY AN ADVANCED INTEGRATION REGIME

BACKGROUND OF THE INVENTION

1. Field of the Invention

Generally, the present disclosure relates to the formation of microstructures, such as advanced integrated circuits, and, more particularly, to the formation of conductive structures, such as copper-based metallization layers, and techniques to reduce electromigration and other stress-induced mass transport effects during operation.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases more rapidly than the number of circuit elements. Thus, a plurality of stacked "wiring" layers, also referred to as metallization layers, are usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines, which may even increase with every new device generation.

Advanced integrated circuits, including transistor elements having a critical dimension of 0.1 μm and even less, may, therefore, typically be operated at significantly increased current densities of up to several kA per $cm^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced mass transport in metal lines and vias, also referred to as "electromigration." Electromigration is caused by momentum transfer of electrons to the ion cores, resulting in a net momentum in the direction of electron flow. In particular at high current densities, a significant collective motion or directed diffusion of atoms may occur in the interconnect metal, wherein the presence of respective diffusion paths may have a substantial influence on the displaced amount of mass resulting from the momentum transfer. Thus, electromigration may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.1 μm or less may require significantly reduced cross-sectional areas of the metal lines and, thus, increased current densities, which may render aluminum less attractive for the formation of metallization layers.

Consequently, aluminum is being replaced by copper and copper alloys, a material with significantly lower resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is therefore usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant mass transport at the interface, which is typically a critical region in view of increased diffusion paths. Currently, tantalum, titanium, tungsten and their compounds, with nitrogen and silicon and the like, are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less, in combination with trenches having a width ranging from 0.1 μm to several μm. Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure so as to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in combination with low-k dielectric materials having a relative permittivity of 3.1 or even less, in order to find new materials and process strategies for forming copper-based lines and vias with a low overall permittivity. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One failure mechanism, which is believed to significantly contribute to a premature device failure, is the electromigration-induced material transport, particularly along an interface formed between the copper and a dielectric cap layer, which may be provided after filling in the copper material in the trenches and via openings, the sidewalls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and silicon carbon nitride, which exhibit a moderately high etch selectivity to typically employed interlayer dielectrics, such as a plurality of low-k dielectric materials, and also suppress the diffusion of copper onto the interlayer dielectric. Recent research results seem to indicate, however, that the interface formed between the copper and dielectric cap layer is a major diffusion path for material transport during operation of the metal interconnect.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly reducing the overall resistance of the corresponding metal line. For instance, a compound of cobalt/tungsten/phosphorous, cobalt/tungsten/boron and the like have proven to be promising candidates for conductive cap layers which may significantly reduce electromigration effects within a corresponding metal line. Although these materials may provide significant performance advantages with respect to electromigration effects, significant efforts may be associated with a respective process flow based on well-established inlaid techniques when corresponding metal alloys have to be integrated into the corresponding metallization scheme. For instance, the respective metal alloys, although providing significant advantages with respect to electromigration, may result in a reduced conductivity at critical portions, at which neighboring metallization layers are connected by corresponding vias. That is, forming a corresponding via opening connecting to the lower-lying metal region having formed thereon the corresponding conductive cap layer, the process sequence based on well-established techniques, such as the deposition of appropriate barrier layers within the via opening, may result in an increased overall series resistance, while an aggressive material reduction at the via bottom may give rise to a corresponding damage of the copper material provided under the conductive cap layer. Thus, corresponding highly complex process steps may be required to reduce undue copper damage while nevertheless reduce undue increase of the series resistance of the corresponding electrical connection.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to enhanced manufacturing techniques in forming electrical connections between neighboring metallization layers, wherein an efficient integration scheme may provide enhanced electromigration performance while nevertheless not unduly affecting the overall electrical performance of the corresponding connection. For this purpose, respective manufacturing processes, used for providing efficient barrier layers within a respective opening connecting to a lower-lying metal region, may be used in order to provide a well-controllable material removal at the via bottom, thereby reducing the series resistance in a well-defined manner while nevertheless providing a desired degree of integrity of the actual metal region covered by the conductive cap layer. In some aspects, a corresponding deposition sequence, typically required for providing a desired layer stack of barrier materials, may be performed in combination with respective sputter processes in order to form a well-defined layer thickness at desired areas, such as sidewall portions of the via opening, while at the same time reducing the material at the bottom and, additionally, forming a well-controlled recess in the conductive cap layer, thereby avoiding any aggressive etch techniques, such as wet chemical etch processes, plasma-based etch processes and the like, substantially without contributing to any additional process complexity. By performing a plurality of corresponding sputter processes, in which the material previously deposited as well as material at the via bottom may act as a donator material or "sputter target," moderately "mild" and thus well-controllable process steps may be performed, thereby maintaining the integrity of the metal region, since the corresponding recess may be adjusted in accordance with the device requirements.

According to one illustrative embodiment, a method comprises forming an opening in a dielectric layer stack of a semiconductor device, wherein the dielectric layer stack is formed above a metal-containing region which comprises a conductive cap layer forming at least one interface with the dielectric layer stack. The method further comprises forming a first barrier layer on sidewalls of the opening and performing a first sputter process to remove material from the bottom of the opening so as to form a recess in the conductive cap layer. Finally, the opening is filled with a metal-containing material.

According to another illustrative embodiment, a method comprises forming an opening in a dielectric layer stack of a semiconductor device, wherein the dielectric layer stack is formed above a metal-containing region comprising a conductive cap layer that forms at least one interface with the dielectric layer stack. Moreover, a sequence of deposition processes is performed in order to form a plurality of barrier layers on sidewalls of the opening. A respective sputter process is performed after at least some of the deposition processes in the sequence to remove material from the bottom of the opening in order to form a recess in the conductive cap layer. Finally, the opening is filled with a metal-containing material.

According to yet another illustrative embodiment, a method comprises forming a conductive cap layer above a copper-containing metal region provided in a dielectric material of a semiconductor device. Furthermore, a dielectric layer stack is formed above the conductive cap layer and an opening is formed in the dielectric layer stack. Moreover, at least a first conductive barrier layer and a second conductive barrier layer are formed by a first deposition process and a second deposition process, respectively. Additionally, a first sputter process is performed after the first deposition process and a second sputter process is performed after the second deposition process to remove material from the bottom of the opening. Moreover, the first and second deposition processes and the first and second sputter processes are controlled to adjust the recessing of the conductive cap layer on the basis of a target depth.

BRIEF DESCRIPTION OF THE DRAWINGS

The disclosure may be understood by reference to the following description taken in conjunction with the accompanying drawings, in which like reference numerals identify like elements, and in which.

Figures 1A, 1B:
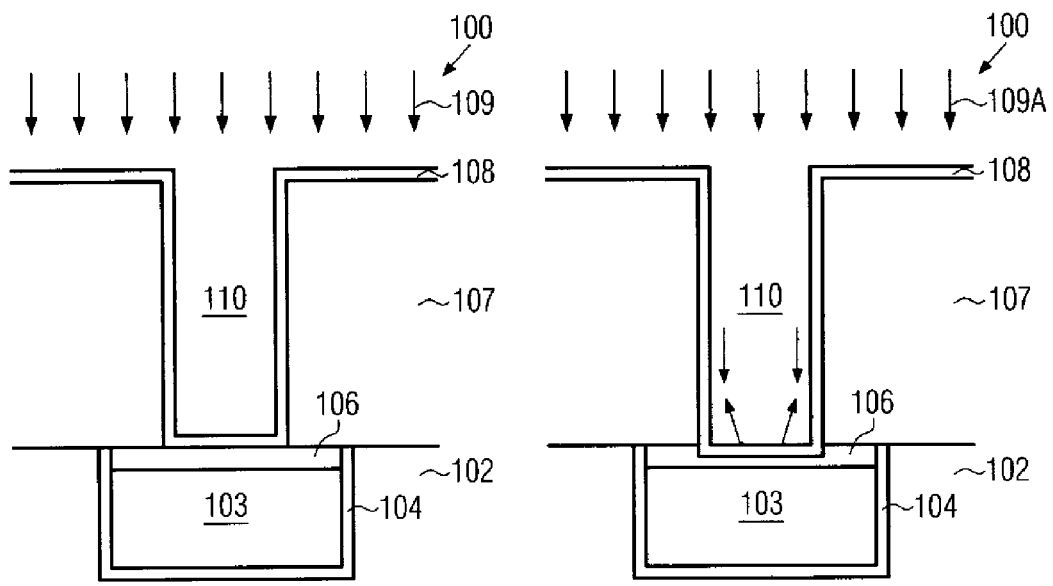
FIGS. 1a-1e schematically illustrate cross-sectional views of a portion of a metallization layer of a semiconductor device during various manufacturing stages in forming a via connecting to a metal region including a conductive cap layer according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein is directed to an efficient process strategy for providing metallization structures, such as copper-based metal lines and respective vias connecting thereto, wherein the respective conductive cap layers comprised of appropriate metal alloys may be used in order to enhance the electromigration performance and reduce any other stress-induced mass transport phenomena in metal lines of advanced semiconductor devices. As previously explained, although the advantageous characteristics of respective metal alloys may provide enhanced electromigration performance, thereby allowing increased current densities within the respective interconnect structures, significant efforts in terms of process complexity, throughput and the like may render conventional approaches less attractive. Furthermore, reduced electrical performance of corresponding critical connections, i.e., the transition area between a metal region and a corresponding via, may be obtained, since, at this critical area, the conductive cap layer may have to form an interface with the corresponding barrier layer in the via opening, thereby possibly contributing to an enhanced electrical resistance and/or causing undue damage and, thus, reduced reliability of the corresponding copper-containing region. Respective issues associated with conventional techniques may arise from moderately aggressive process steps, such as wet chemical etch processes, plasma-based etch processes and the like, in order to appropriately form the opening into the lower-lying metal region in an attempt to not unduly damage the copper-containing region and also provide a tolerable series resistance. Contrary to this approach, the embodiments disclosed herein may provide an efficient process strategy by appropriately combining respective process steps required for forming an appropriate barrier layer stack in a corresponding via opening, wherein the combination of these process steps may be controlled such that a plurality of individual steps, each of which may contribute to the overall process, in a highly controllable manner, may commonly result in a desired degree of recess in the corresponding conductive cap layer. Consequently, increased overall controllability of the corresponding process sequence may be accomplished, substantially without adding any additional process steps, thereby significantly reducing the overall process complexity and thus providing an enhanced process throughput compared to conventional approaches while nevertheless increasing electrical performance and electromigration performance. That is, the conductive cap layer, which may be comprised of compounds such as cobalt/tungsten/phosphorous (CoWP), cobalt/tungsten/boron (CoWB), nickel/molybdenum/boron (NiMoB), nickel/molybdenum/phosphorous (NiMoP) and the like may be provided such that, in particular, failure prone locations in metallization layers, such as the transition area between vias and metal lines, may be significantly reinforced in that the via may not extend through the conductive cap layer but reliably terminate therein, thereby ensuring a strong interface with the underlying metal, which may comprise copper or copper alloys, while nevertheless maintaining the overall series resistance at a moderately low level.

It should be appreciated that the embodiments disclosed herein may provide an efficient scalable process sequence, since the corresponding manufacturing processes may have to be performed anyway during the formation of the corresponding via opening and the subsequent deposition of respective barrier materials, wherein, however, controlling a parameter of the respective processes may be performed on the basis of pre-established target values so as to reduce negative effects of each individual process step in terms of damage of the metal material while nevertheless obtaining a process result corresponding to the respective target values in terms of layer thickness, material composition and the like. Hence, the subject matter disclosed herein may be applied advantageously in extremely scaled devices, such as semiconductor devices of the 65 nm technology node and less.

FIG. 1a schematically illustrates a cross-sectional view of a semiconductor device 100 during a moderately advanced manufacturing stage. The semiconductor device 100 comprises a substrate 101, which may represent any substrate that is appropriate for the formation of circuit elements thereon. For instance, the substrate 101 may be a bulk semiconductor substrate, or an insulating substrate having formed thereon a semiconductor layer, such as a crystalline silicon region, a silicon/germanium region or any other III-V or II-VI semiconductor compound and the like. Typically, the substrate 101 may represent a carrier having formed thereon a large number of circuits elements, such as transistors, capacitors and the like, as required for defining a complex integrated circuit. These circuit elements may be electrically connected in accordance with a specific circuit design by means of one or more metallization layers, wherein, for convenience, only a portion of a respective metallization layer stack may be shown and described herein. It may, however, be readily appreciated that the concept of enhancing the electromigration or stress-induced mass transport phenomena by using a conductive cap layer in combination with enhanced process strategies for forming a via opening connecting thereto may be applied to any complex device configuration including a plurality of metallization layers. In illustrative embodiments, the metal regions or lines may be copper-based metal lines and regions, which in particular embodiments may be formed in a low-k dielectric material, which may be understood as a material having a dielectric constant of 3.0 or less.

The semiconductor device 100 may comprise a dielectric layer 102, and may represent the dielectric material of a metallization layer or any other interlayer dielectric material and the like. In highly advanced semiconductor devices, the dielectric layer 102 may comprise a low-k dielectric material in order to reduce the parasitic capacitance between neighboring metal lines. Furthermore, a metal region 103 is formed in the dielectric layer 102 and may be comprised of a metal-containing material, such as a copper-containing metal, which may typically be confined on sidewall portions thereof and the bottom by a barrier layer 104. As previously explained, when copper or other highly diffusive material compounds are present in the metal region 103, the barrier layer 104 may have to provide enhanced adhesion, diffusion blocking characteristics and the like. Consequently, the barrier layer 104 may typically be comprised of two or more material layers of different composition so as to maintain the integrity of the metal region 103 and the surrounding dielectric material of the layer 102, while at the same time provide the required stability of the corresponding interface in terms of stress-induced mass transport phenomena. For example, tantalum nitride in combination with tantalum may frequently be used for copper-based metallization regimes. However, many other material compositions may be used in accordance with device requirements. Moreover, the metal region 103 is further confined by a conductive cap layer 106 that may be formed by an appropriately selected metal alloy, for instance, a composition as previously described. Furthermore, the semiconductor device 100 may comprise a second dielectric layer 107, which may be provided in the form of a layer stack, wherein at least one or more material layers may be provided in the form of a low-k dielectric material, depending on the device requirements. In some illustrative embodiments, the dielectric layer 102 may represent the dielectric material of a further metallization layer including the dielectric material for a via layer, in which respective vias are to be formed to provide an electrical connection between the metal region 103, representing a metal line or any other metal region of a first metallization layer and respective metal lines to be formed in a portion of the dielectric layer 107. In other cases, the dielectric layer 107 may represent the material of a via layer, wherein respective metal lines of a next metallization level may have to be formed by providing a separate dielectric material in a further advanced manufacturing stage. Furthermore, in this manufacturing stage, the dielectric layer 107 may include an opening 110 extending to the conductive cap layer 106. The opening 110 and horizontal portions of the dielectric layer 107 may be covered by a first barrier layer 108, comprised of any appropriate material, such as tantalum nitride and the like.

A typical process flow for forming the semiconductor device 100 as shown in FIG. 1a may comprise the following processes. After any well-established process techniques for forming circuit elements and/or microstructure elements in and on the substrate 101, the dielectric layer 102 may be formed, which may comprise two or more sub-layers, depending on device requirements. For example, the dielectric layer 102 may be formed on the basis of well-established plasma enhanced chemical vapor deposition (PECVD) techniques, when comprising silicon dioxide, silicon nitride and the like. However, other deposition techniques may be used, such as spin-on techniques for low-k polymer materials and the like. Thereafter, an appropriately designed lithography process may be performed in order to provide an appropriate resist mask to be used to pattern a respective trench on the basis of well-established anisotropic etch techniques. Next, the barrier layer 104 may be formed by any appropriate deposition technique, such as sputter deposition, chemical vapor deposition, atomic layer deposition and the like. For instance, the barrier layer 104 may be comprised of conductive materials, such as, tantalum, tantalum nitride, titanium, titanium nitride, tungsten, tungsten nitride, or any other appropriate materials, wherein, typically, two or more different material compositions and layers may be provided as is required for achieving the desired adhesion and diffusion blocking characteristics. It should be appreciated that the barrier layer 104 may also be formed on the basis of respective process regimes as will be described with reference to the barrier layer 108 and any further barrier layers to be formed thereon. For example, the barrier layer 104 may comprise, in addition to the above-identified materials, one or more of CoWP, CoWB, NiMoB and NiMoP, at least as an uppermost layer thereof.

After the deposition of the barrier layer 104, a copper seed layer may be deposited by any appropriate deposition techniques, such as sputter deposition, electroless deposition and the like, if a copper-based material is to be filled in on the basis of well-established wet chemical deposition techniques. Corresponding recipes for forming a seed layer are well established in the art. Thereafter, the metal material for the region 105 may be deposited on the basis of, for instance, electroplating, electroless plating and the like, wherein typically a certain amount of excess material may be provided in order to ensure a reliable filling of the corresponding trench. The corresponding excess material may be removed on the basis of chemical mechanical polishing (CMP), electrochemical polishing and the like on the basis of well-established recipes. For example, a substantially planar surface topology may be provided by the CMP process and subsequently an electrochemical etch process may be performed for removing further residual material and forming a recess in the corresponding metal region 103. In other embodiments, the CMP process used for planarizing the surface topology may be continued on the basis of the specified over-polish time so as to form a recess in the region 103, if required. During the corresponding process sequence for planarizing the surface topology and/or for forming a recess, if required, excess material of the barrier layer 104 may also be removed.

In some illustrative embodiments, a catalyst material may then be deposited, which may be accomplished on the basis of highly selective deposition techniques, for instance by using an electroless plating process, thereby selectively preparing the surface of the metal region 103 for the deposition of the material of the conductive cap layer 106. It should be appreciated, however, that many other process strategies may be used so as to allow a highly selective deposition of the material of the conductive cap layer 106 on the basis of wet chemical deposition recipes. Hence, thereafter, the cap layer 106 may be formed on the basis of an electrochemical process, thereby providing a strong interface with the metal region 103, which may have enhanced characteristics in terms of electromigration behavior as previously explained. After the deposition of the cap layer 106, any excess material which may possibly have been formed during the wet chemical deposition process may be removed and the surface topography of the device 100 may be planarized, if required, on the basis of well-established techniques, such as CMP, electrochemical etching and the like.

Next, the dielectric layer 107, typically a dielectric layer stack, may be formed on the conductive cap layer 106 and the dielectric layer 102. For instance, depending on the desired material composition of the dielectric layer 107, respective deposition techniques may be used, wherein typically an etch stop layer may be provided as a first layer, as will be described later on, while, in advanced manufacturing techniques, material of the layer 107 may be directly formed on the conductive cap layer 106. Thereafter, a corresponding patterning process sequence may be performed to form the opening 110 in the dielectric layer 107, wherein well-established lithography processes in combination with sophisticated etch techniques may typically be used. A corresponding etch sequence for forming the opening 110 in a highly controllable manner will be described later on with reference to FIGS. 2a and 2b.

Next, the first barrier layer 108 may be formed on the basis of an appropriate deposition technique, such as physical vapor deposition (PVD), chemical vapor deposition (CVD), self-limiting CVD processes, also referred to as atomic layer deposition (ALD) processes, electrochemical deposition techniques and the like. In some illustrative embodiments, the first barrier layer 108 may be deposited by a process 109 performed in an ambient that enables the creation of a corresponding sputter atmosphere so as to controllably remove material from the bottom of the opening 110. For example, the deposition process 109 may be performed as a sputter deposition process, in which one or more appropriate species, such as tantalum and nitrogen, may be deposited on exposed surface portions of the opening 110 and the layer 107 on the basis of well-established recipes. In other cases, a corresponding deposition ambient may be established during the process 109, wherein the corresponding deposition ambient may then be changed to create an appropriate plasma for removing material of the layer 108. Thus, the deposition process 109 may be a first process of a plurality of deposition processes so as to form the first barrier layer 108, which may represent one of two or more barrier components to be formed within the opening 110, wherein the respective process parameters may be adjusted to obtain the desired process result, for instance, in terms of layer thickness at sidewall portions of the opening 110, and the like.

FIG. 1b schematically illustrates the device 100 during a first sputter process 109A, which is performed, in some illustrative embodiments, in situ with the process 109, in order to controllably remove material from the bottom of the opening 110. Thus, the process 109A may be established in the same process chamber, for instance, by applying a bias voltage to the substrate 101 in order to obtain a highly directional ion bombardment at the bottom of the opening 110, thereby releasing corresponding material previously deposited. Furthermore, the respective sputter process 109A may result in the release of any contaminants, such as, oxygen, fluorine and the like, which may be present in minute amounts due to any preceding processes, for instance, a respective etch process for forming the opening 110. A portion of the material released by the process 109A may re-deposit on sidewalls of the opening 110, while highly volatile species, such as oxygen and fluorine and the like, may nevertheless be released to a certain degree into the sputter ambient and may be removed. Even if tiny amounts of these contaminants may re-deposit within the opening 110, less critical areas, such as the sidewall portions thereof, may be involved as deposition areas, thereby contributing to a displacement of respective contaminants from the critical bottom area to the less critical sidewall areas. Furthermore, the deposition process 109 may be performed such that the subsequent sputter process 109A may enable an efficient material removal at the bottom of the opening 110 and may also result in a corresponding mild material removal of the conductive cap layer 106, while not unduly affecting other horizontal portions of the dielectric layer 107, such as trench bottoms, as will be explained later on, since here, typically, an increased layer thickness may be provided, wherein also the corresponding sputter effect may result in a corresponding immediate redistribution of the barrier material. It should be appreciated that respective process parameters for the first deposition process 109 and the subsequent sputter process 109A may be established on the basis of respective test runs in order to identify the corresponding deposition rates and etch rates for a specific material composition and device geometry.

Figures 1C, 1D:
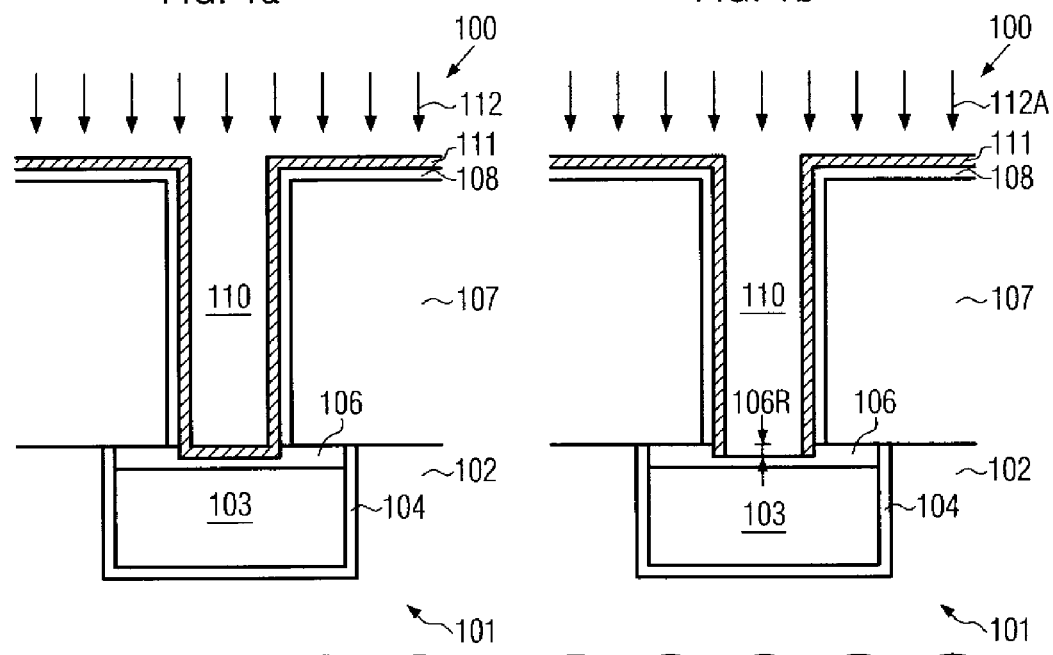

FIG. 1c schematically illustrates the device 100 during a further deposition process 112 in order to form a second barrier layer 111 on the first barrier layer 108, at least at the sidewalls of the opening 110 and horizontal device portions outside the opening 110. The second barrier layer 111 may be comprised of a different material composition, selected to provide, in combination with the first barrier layer 108, the desired barrier characteristics, as previously explained. For example, the first barrier layer 108 may be comprised of tantalum nitride, which is a well-established barrier material for providing enhanced adhesion to the surrounding dielectric material of the layer 107. The second barrier layer 111 may be provided, for instance, in the form of a tantalum layer, which is known to have a good adhesion to copper-based materials and may also efficiently suppress any copper diffusion while also providing superior interface characteristics in terms of electromigration. The second barrier layer 111 may be deposited during the process 112, for instance, within the same process chamber on the basis of appropriately selected deposition parameters in order to obtain a desired layer thickness. For example, the process 112 may represent a sputter deposition process. In other illustrative embodiments, the first and second barrier layers 108, 111 may be comprised of substantially the same material composition in order to provide a desired final layer thickness, wherein the sputter process 109A may enable an intermittent removal of unwanted material from the bottom of the opening 110 in a more controllable fashion. That is, the formation of the first barrier layer 108 with a reduced layer thickness and the subsequent sputter process 109A may provide enhanced controllability of the respective material removal, substantially without damaging other device areas. Since the corresponding deposition processes 109 and 112, as well as the sputter process 109A, may be performed in the same process chamber, additional process complexity may not be substantially added to the overall process flow.

In other illustrative embodiments, the deposition process 109 may represent a first step of a self-limiting deposition process, in which a pre-form of the finally desired first barrier layer may be deposited, wherein the subsequent sputter process 109A may provide a high directional removal of the corresponding pre-form at the bottom of the opening 110. In the subsequent deposition step 112, which may represent a second step of the self-limiting process, the corresponding chemical reaction may be substantially restricted to areas having formed thereon the layer 108 so that a corresponding barrier material may not be substantially formed at the bottom of the opening 110, while nevertheless a highly controllable removal of contaminants and material of the conductive cap layer 106 may be achieved. Thus, a reliable coverage of critical device areas, such as lower sidewall portions of the opening 110, may be achieved, since the corresponding sputter process 109A may provide enhanced deposition at these areas during the redistribution of material from the bottom. Depending on device requirements, the corresponding sequence of the deposition processes 109 and 112 may be repeated with an intermediate sputter process 109A. Thus, a material layer of highly controllable layer thickness may be provided on the basis of the above process sequence, such as an ALD-like process or a sputter deposition process, in which the same type of material may be deposited during the individual processes 109 and 112. Furthermore, during the respective sputter process 109A, a highly controllable and thus mild material removal at the bottom of the opening 110 may occur, thereby also controlling a degree of recessing the conductive cap layer 106. In other embodiments, as illustrated in FIGS. 1a and 1b, the barrier materials 108 and 111 may represent different material compositions, wherein it should be appreciated that each of the layers 108, 111 may be formed on the basis of a corresponding deposition and sputter process sequence described above.

FIG. 1d schematically illustrates the device 100 during a further sputter process 112A for removing material of the layer 111 at the bottom of the opening 110, wherein a respective recess 106R may also be increased in a highly controllable manner. Also, in this case, respective contaminants in this layer may be redistributed or even completely removed from within the opening 110, as previously explained. Consequently, a highly efficient process sequence is provided, wherein respective process results, for instance, in terms of layer thickness of the barrier layers 108, 111 as well as the depths of the recess 106R, may be obtained on the basis of a plurality of individual processes, each of which may be performed with high controllability on the basis of appropriately selected process parameters. Furthermore, since the corresponding individual process steps may be performed with less impact, for instance, compared to conventional strategies involving highly aggressive sputter etch processes, wet chemical etch processes, plasma-based etch processes and the like, in addition to providing a high degree of the superior controllability, undue damage of sensitive device areas, such as low-k dielectric materials, may be avoided or at least be significantly reduced, as will also be described in more detail with reference to FIG. 3. Since the corresponding sputter processes 109A, 112A are appropriately integrated into the process sequence, as may be required anyway for providing the desired barrier materials, the process sequence may substantially not contribute to additional process complexity, for instance, with respect to a conventional approach using a single highly aggressive sputter etch process after the deposition of a first barrier component, wherein even additional process strategies and steps may be required so as to ensure the integrity of the copper-based material in the region 103. Thus, in the embodiments described above, any additional process time, for instance, required for repeatedly establishing a deposition ambient and an ambient for the sputter processes 109A, 112A, may readily be over-compensated for by the high degree of controllability, wherein even a reduced overall process time may be achieved compared to conventional approaches, when additional process steps including additional substrate handling activities and the like may be required in conventional approaches.

It should be appreciated that further barrier layers may be formed if a more complex barrier layer stack may be desired. During the formation of the corresponding barrier layer stack, one or more components thereof may be formed in accordance with the process sequence as described above. That is, during formation of the entire barrier layer stack, at least one or more "mild" sputter processes may, in combination with respectively adapted deposition parameters, provide the high degree of controllability of the process and integrity of the copper-based region 103 when forming the barrier material within the opening 110.

Figure 1E:
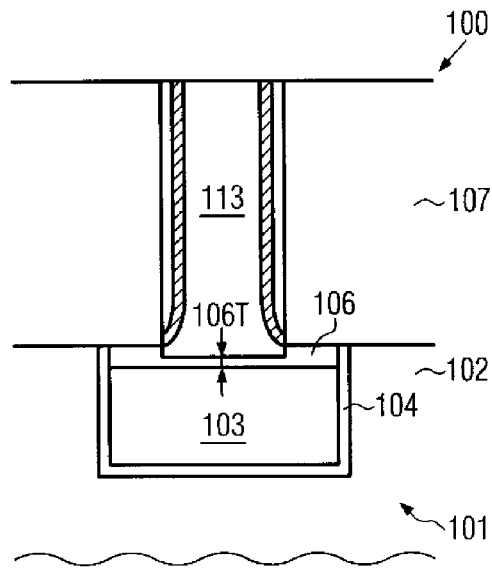

FIG. 1e schematically illustrates the device 100 in a further advanced manufacturing stage. Here, a highly conductive material, such as a copper-based material, is filled in the opening 110, thereby forming a respective metal region 113, which may represent a corresponding metal line or a via opening connecting to the underlying metal region 103. Furthermore, in the illustrative embodiment shown, a remaining thickness 106T of the conductive cap layer 106 may provide the enhanced electromigration characteristics due to the superior interface properties, as previously explained, while, additionally, a reliable coverage of the sensitive metal region 103 during the further processing of the formation of the respective barrier layers 108, 111 may be achieved. The metal region 113 may be formed on the basis of well-established deposition techniques, such as electroplating, electroless plating or any combinations thereof. It should be appreciated that a corresponding wet chemical deposition process may be performed on the basis of a corresponding seed layer or catalyst layer (not shown), which may be deposited on the basis of appropriate deposition techniques, such as sputter deposition, CVD, electroless plating and the like. As a consequence, the metal region 113 may provide a highly reliable connection to the metal region 103, wherein a corresponding series resistance may be substantially defined by the overall dimensions and by the thickness 106T of the recessed conductive cap layer 106, which may be adjusted in a highly controllable fashion, as previously explained. Thus, a corresponding electrical performance of the metal regions 103 and 113 may not be unduly reduced, since the effective thickness 106T may be controllably adjusted, while, on the other hand, significant damage in the region 103 during the preceding process sequence for forming the barrier materials and the metal region 113 may be significantly reduced compared to conventional strategies, thereby contributing to increased reliability and also enhancing electrical performance.

Figures 2A, 2B:
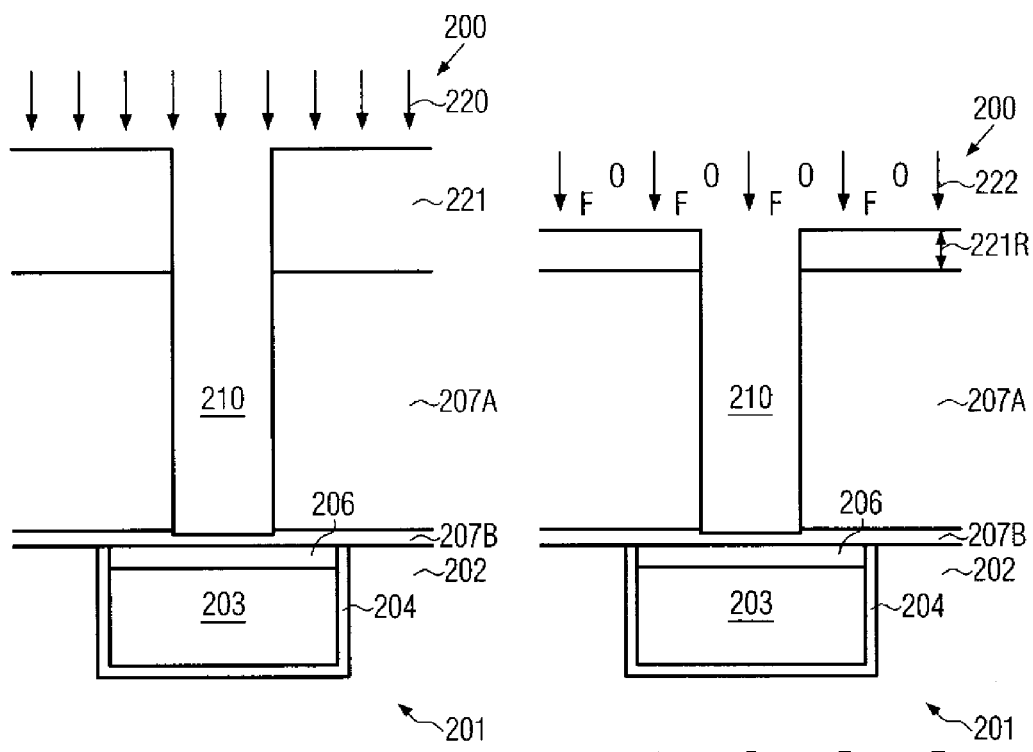
FIGS. 2a-2b schematically illustrate a cross-sectional views of a semiconductor device during various manufacturing stages in forming a opening that connects to a conductive cap layer of a metal region, in a highly controllable manner according to further illustrative embodiments.

With reference to FIGS. 2a-2b, further illustrative embodiments will now be described, in which a highly controllable sequence may be used for forming a respective opening in a dielectric layer so as to connect to a conductive cap layer.

FIG. 2a schematically illustrates a semiconductor device 200 comprising a substrate 201 having formed thereon a dielectric layer 202, in which is provided a metal region 203 confined by a barrier layer 204 and a conductive cap layer 206. Regarding the specifics of these components, as well as any processes for forming the same, it is referred to the corresponding components previously described with reference to the device 100. Furthermore, a dielectric layer stack 207 is formed on the dielectric layer 202 and may comprise a dielectric material 207A and an etch stop material 207B. The dielectric material 207A may represent any appropriate dielectric material in accordance with device requirements, while the etch stop layer 207B may be selected so as to have a high etch selectivity during a corresponding anisotropic etch process 220 for forming an opening 210 in the dielectric material 207A. It should be appreciated that the etch stop layer 207B may be selected with respect to layer thickness and material composition so as to provide the desired etch stop characteristics, since efficient confinement of copper and copper alloys in the metal region 203 may be accomplished on the basis of the conductive cap layer 206. Thus, even dielectric materials of moderately low permittivity may be used, as long as a respective etch selectivity may be provided. In some illustrative embodiments, the etch stop layer 207B may even be provided as a laterally restricted layer, in order to cover an area corresponding to the opening 210, while the remainder of the dielectric material 207 and conductive cap layer 206 may remain uncovered, thereby reducing the overall permittivity of the resulting dielectric layer stack.

The anisotropic etch process 220 may be performed on the basis of an appropriate etch mask 221, which may typically include a resist material formed on the basis of advanced lithography techniques. The etch process 220 may be reliably controlled on the basis of the etch stop layer 207B, wherein the high etch selectivity may result in a corresponding low material removal of the etch stop layer 207B, so that, in some embodiments, 30% or even less of the material of the etch stop layer 207B may be removed during a corresponding over-etch time. Thus, the etch stop layer 207A may be opened in a subsequent process on the basis of highly uniform across-substrate conditions with respect to the remaining thickness to be removed, thereby enhancing the controllability of the overall process sequence for exposing a portion of the conductive cap layer 206.

FIG. 2b schematically illustrates the semiconductor device 200 during a subsequent etch process 222 designed to reduce the thickness of the etch sop layer 207B to a specified target value or to completely expose the conductive cap layer 206. In the embodiment shown, the etch process 222 is designed to remove the resist mask 221, wherein, in the example shown in FIG. 2b, a residual thickness 221R may still have to be removed by the process 222. In one illustrative embodiment, the etch processes 220 and 222 may be performed in situ, i.e., the corresponding etch processes may be performed in the same etch chamber, thereby advantageously using any by-products created in the preceding etch process 220 as a source of fluorine. As is well known, respective polymer materials may be created during the etch process 220, which is typically performed on the basis of a fluorine-containing chemistry in combination with inhibitor materials, thereby resulting in the respective fluorine-containing polymer materials, which may deposit on chamber walls and the like. Consequently, the etch process 220 substantially designed to remove the resist mask 221 on the basis of oxygen plasma may also include minute amounts of fluorine, since the oxygen plasma may also attack the respective polymer materials and release the fluorine component. During the etch process 222, approximately 70%, or even more, of the remaining material of the etch stop layer 207B may be removed, wherein the moderately low progression of material removal at the bottom may provide a high degree of controllability. For example, the resist mask 221 may be efficiently removed and a corresponding over-etch time may be provided to expose the conductive cap layer 206 or maintain a certain amount of the etch stop layer 207B if required. A respective residual material of the etch stop layer 207B may then be efficiently removed during the deposition and sputter procedure, as previously described with reference to the device 100. In still other illustrative embodiments, fluorine may be added by using an external source, thereby providing increased flexibility in adjusting the overall etch time. For instance, a respective fluorine component may be added at any appropriate stage during the etch process 222 in order to remove the desired amount of etch stop material.

Thereafter, the further processing may be continued as is also described with reference to the device 100 for forming corresponding barrier materials within the opening 210. Hence, the conductive cap layer 206 may be exposed in a highly controllable manner, thereby also providing uniform behavior during the subsequent deposition and removal of barrier materials in order to define a uniform recess in the cap layer, as previously described. Hence, a reduced initial thickness of the cap layer 206 may be used, thereby even further enhancing process efficiency in terms of cycle time.

Figure 3:
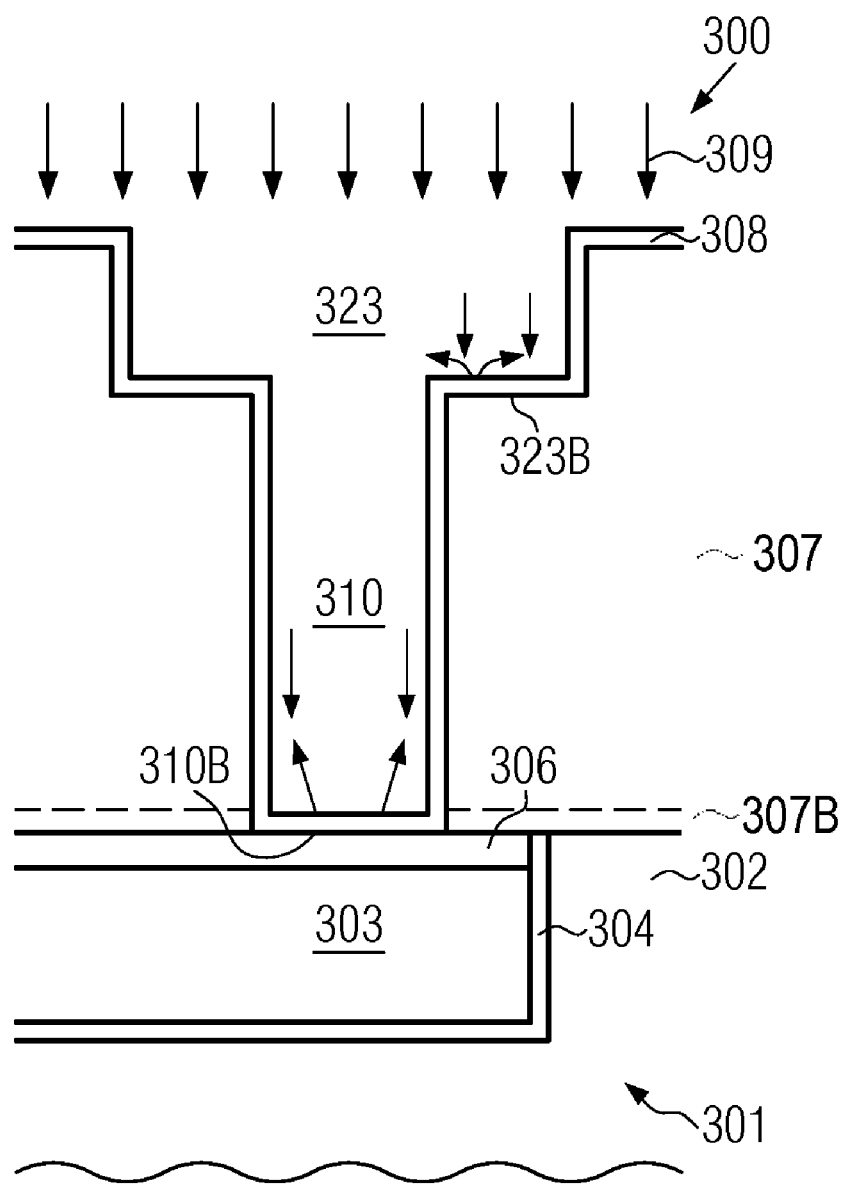
FIG. 3 schematically illustrates a cross-sectional view of a metallization layer of a semiconductor device during a manufacturing stage in accordance with a dual damascene strategy according to further illustrative embodiments.

With reference to FIG. 3, further illustrative embodiments will now be described, in which a dual damascene strategy may be used in forming a via and a metal line in a common manufacturing sequence.

FIG. 3 schematically illustrates a semiconductor device 300 comprising a substrate 301 having formed thereabove a dielectric layer 302, in which a metal line 303 may be formed. The metal line 303 may be confined by a barrier layer 304 and a conductive cap layer 306. Furthermore, a dielectric layer stack 307 may be formed above the dielectric layer 302 and the metal lines 303 wherein the dielectric layer stack 307 may comprise an etch stop layer 307B, if required. Furthermore, in this manufacturing stage, an opening 310 extending at least to the conductive cap layer 306 may be provided, wherein a corresponding trench 323 may be formed in an upper portion of the stack 307 and may represent a respective metal line of a higher metallization level. It should be appreciated that the components described so far may have similar characteristics with respect to material composition and manufacturing processes as previously described with reference to the devices 100 and 200.

The trench opening 323 may be formed on the basis of well-established process techniques, wherein, in some approaches, the trench 323 may be formed prior to the opening 310, while, in other processes, the opening 310 may be formed prior to the trench 323. Furthermore, in this manufacturing stage, a first barrier layer 308 may be formed within exposed surface areas of the opening 310 and the trench 323, wherein a respective deposition process 309 may be used, as is also previously described with reference to the deposition process 109. That is, a desired type of material may be deposited in order to form the layer 308 in accordance with respective process parameters to obtain the desired layer thickness. After the deposition 309, which may represent a first deposition process of a plurality of process steps as previously explained, a corresponding sputter process may be performed to redistribute material at the bottom 310B of the opening 310. Consequently, contaminants may be efficiently removed and unwanted material of the barrier layer 308 may also be redistributed to sidewall portions of the opening 310, while additionally a highly controllable recess in the cap layer 306 may be formed, as previously explained. Since the corresponding thickness obtained during the deposition 309 may be appropriately selected, the corresponding sputter process may not substantially negatively affect the trench bottom 323B, since typically an increased layer thickness may be generated during the preceding deposition process 309, due to geometrical differences with respect to the opening 310 and the trench 323. Hence, the "mild" sputter process may also result in a certain redistribution of material at the trench bottom 323B, which may, however, be substantially re-deposited at the horizontal trench bottom 323B, so that the respective sputter process may not significantly damage the corresponding dielectric material of the layer 307. Thereafter, a further deposition process may be performed, for instance, on the basis of the same material or a different material composition, wherein a subsequent sputter process may also efficiently provide for material re-distribution at the bottom 310B, while substantially not negatively affecting the dielectric material at the trench bottom 323B. In this way, a desired material composition may be provided for the barrier layer within the trench 323 and the opening 310, thereby creating the desired configuration at the bottom 310B while nevertheless providing a reliable barrier layer at the bottom 323B. Thereafter, the further processing may be continued by filling the via opening 310 and the trench 323 during a common wet chemical deposition process on the basis of well-established recipes.

As a result, the subject matter disclosed herein addresses the need for preserving the electrical performance of metallization structures at the transition from one metallization level to another, wherein the advantageous characteristics of a conductive cap layer may be maintained, i.e., the respective strong interface with enhanced electromigration behavior in addition to a substantially undamaged copper-containing material may be provided, since the overall integrity and consistency of the conductive cap layer may be preserved, while nevertheless the series resistance may be maintained at a low level. For this purpose, aggressive patterning on the basis of wet chemical or dry etch processes may be substantially avoided and at least the corresponding sequence for forming a desired barrier material composition may be designed to include a plurality of deposition steps and intermittent sputter processes, each of which may have low impact, thereby enhancing the controllability of the overall deposition sequence. Thus, the integrity of the metal region may be maintained, wherein the overall series resistance may be adjusted by combining the responding recess in the conductive cap layer. Consequently, process steps may be used as are typically required for depositing the desired material composition of the barrier layer with intermediate sputter processes, thereby substantially not contributing to process complexity, while substantially avoiding additional process steps except for minor changes and adaptations in order to establish the respective sputter ambient, which may be accomplished in an efficient in situ sequence. In some embodiments, efficient etch regimes for forming the corresponding via opening may be combined with the enhanced deposition regime for the barrier material. Consequently, the above-described process sequence is scalable for any further device generations and may be readily integrated into the respective process strategies without additional complexity, wherein even the overall process time may be reduced due to the absence of additional etch process steps, such as additional plasma etch processes and the like. Furthermore, the corresponding process sequence may result in a reduced degree of contamination at the respective via bottom connecting to the highly conductive metal material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a dielectric stack layer above a metal-containing region of a semiconductor device, said metal-containing region comprising a conductive cap layer forming at least one interface with said dielectric layer stack;
    forming an opening in said dielectric stack layer;
    forming a first barrier layer on sidewalls of said opening;
    performing a first sputter process to remove material from a bottom of said opening to form a recess in said conductive cap layer, controlling said first sputter process to reduce a thickness of said conductive cap layer at said bottom of said opening and control a depth of said recess wherein said recess does not extend through said conductive cap layer; and filling said opening with a metal-containing material.

2. The method of claim 1, wherein said first barrier layer is formed by a physical vapor deposition process.

3. The method of claim 1, further comprising forming a second barrier layer on said first barrier layer and performing a second sputter process to remove material from said bottom of said opening, controlling said second sputter process to further reduce said thickness of said conductive cap at said bottom of said opening and further extend said depth of said recess wherein said recess does not extend through said conductive cap layer.

4. The method of claim 1, wherein said conductive cap layer comprises at least one of a compound comprised of cobalt, tungsten and phosphorous (CoWP), a compound comprised of cobalt, tungsten and boron (CoWB), a compound comprised of nickel, molybdenum and boron (NiMoB) and a compound comprised of nickel, molybdenum and phosphorous (NiMoP).

5. The method of claim 1, wherein said metal is copper.

6. The method of claim 1, wherein said metal-containing region represents a metal line in a metallization layer of said semiconductor device.

7. The method of claim 1, further comprising forming a trench in said dielectric layer stack, said opening extending from said trench to said conductive cap layer.

8. The method of claim 6, wherein forming said opening comprises providing an etch stop layer in said dielectric layer stack, performing a first etch process for etching through a first dielectric material of said dielectric layer stack and controlling said first etch process on the basis of said etch stop layer and etching said etch stop layer in a second etch process, wherein said second etch process removes more than approximately 70% of an initial thickness of said etch stop layer.

9. The method of claim 8, wherein said second etch process is performed on the basis of an oxygen plasma and fluorine.

10. The method of claim 7, wherein said trench is formed after forming said opening.

11. The method of claim 7, wherein said trench is formed prior to forming said opening.

12. A method, comprising:
forming a dielectric layer stack above a metal-containing region of a semiconductor device, said metal-containing region comprising a conductive cap layer forming at least one interface with said dielectric layer stack;
forming an opening in said dielectric stack layer;
performing a sequence of deposition processes to form a plurality of barrier layers successively on sidewalls of said opening;
performing a respective sputter process after at least some of said deposition processes in said sequence to remove material from a bottom of said opening to form a recess in said conductive cap layer, controlling said respective sputter process to reduce a thickness of said conductive cap layer at said bottom of said opening and control a depth of said recess wherein said recess does not extend through said conductive cap layer; and
filling said opening with a metal-containing material.

13. The method of claim 12, wherein each of said deposition processes is followed by a sputter process.

14. The method of claim 12, wherein at least one of the deposition processes in said sequence comprises a sputter deposition process.

15. The method of claim 12, wherein said dielectric layer comprises an etch stop layer for controlling an etch process to etch through a dielectric material formed above said etch stop layer and wherein approximately 70% or more of said etch stop layer within said opening are removed on the basis of an oxygen plasma.

16. The method of claim 12, wherein said conductive cap layer comprises at least one of a compound comprised of cobalt, tungsten and phosphorous (CoWP), a compound comprised of cobalt, tungsten and boron (CoWB), a compound comprised of nickel, molybdenum and boron (NiMoB) and a compound comprised of nickel, molybdenum and phosphorous (NiMoP).

17. A method, comprising:
forming a conductive cap layer above a copper-containing metal region provided in a dielectric material of a semiconductor device;
forming a dielectric layer stack above said conductive cap layer;
forming an opening in said dielectric layer stack;
forming at least a first conductive barrier layer and a second conductive barrier layer by a first deposition process and a second deposition process;
performing a first sputter process after said first deposition process and a second sputter process after said second deposition process to remove material from a bottom of said opening and form a recess in said conductive cap layer; and
controlling said first and second deposition processes and said first and second sputter processes to adjust a depth of said recess in said conductive cap layer on the basis of a target depth such that said recess does not extend through said conductive cap layer after performing said first and second deposition processes and said first and second sputter processes.

18. The method of claim 17, wherein said target depth is selected to maintain a portion of said conductive cap layer.

* * * * *